US010928735B2

(12) United States Patent
Van De Kerkhof et al.

(10) Patent No.: US 10,928,735 B2
(45) Date of Patent: Feb. 23, 2021

(54) PATTERNING DEVICE

(71) Applicant: ASML Netherlands B.V., Veldhoven (NL)

(72) Inventors: Marcus Adrianus Van De Kerkhof, Helmond (NL); Laurentius Cornelius De Winter, Vessem (NL); Eelco Van Setten, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/698,868

(22) Filed: Nov. 27, 2019

(65) Prior Publication Data

US 2020/0096875 A1 Mar. 26, 2020

Related U.S. Application Data

(63) Continuation of application No. PCT/EP2018/061122, filed on May 2, 2018.

(30) Foreign Application Priority Data

Jun. 1, 2017 (EP) .................................... 17173891

(51) Int. Cl.
*G03F 7/20* (2006.01)
*G03F 1/24* (2012.01)
(52) U.S. Cl.
CPC ............ *G03F 7/70316* (2013.01); *G03F 1/24* (2013.01)

(58) Field of Classification Search
CPC ........ G03F 7/70316; G03F 1/24; G03F 7/001; G03F 7/70283
See application file for complete search history.

(56) References Cited

U.S. PATENT DOCUMENTS

2003/0031937 A1* 2/2003 Yan ........................ B82Y 10/00
430/5
2003/0091910 A1 5/2003 Schwarzl et al.
(Continued)

OTHER PUBLICATIONS

PCT International Search Report and Written Opinion of the International Searching Authority, dated Aug. 21, 2018, in corresponding PCT International Application No. PCT/EP2018/061122 (12 pgs.).

*Primary Examiner* — Steven Whitesell Gordon
(74) *Attorney, Agent, or Firm* — Finnegan, Henderson, Farabow, Garrett & Dunner LLP

(57) ABSTRACT

A patterning device for use with a lithographic apparatus, the device comprising an absorber portion configured to absorb incident radiation and to reflect a portion of incident radiation, the absorber portion comprising a first layer and a second layer, the first layer of the absorber portion comprising a first material that is different from a second material of the second layer of the absorber portion; a reflector portion arranged beneath the absorber portion, the reflector portion being configured to reflect incident radiation; and a phase tune portion arranged between the reflector portion and the absorber portion, the phase tune portion being configured to induce a phase shift between the radiation reflected by the reflector portion and the portion of radiation reflected by the absorber portion such that the radiation reflected by the reflector portion destructively interferes with the portion of radiation reflected by the absorber portion.

20 Claims, 8 Drawing Sheets

(56) References Cited

U.S. PATENT DOCUMENTS

| | | | |
|---|---|---|---|
| 2005/0282072 A1* | 12/2005 | Hector | B82Y 10/00 430/5 |
| 2006/0281017 A1 | 12/2006 | Kim et al. | |
| 2009/0305147 A1 | 12/2009 | Constancias | |
| 2014/0285783 A1* | 9/2014 | Dinger | B82Y 10/00 355/67 |
| 2015/0212402 A1 | 7/2015 | Patil et al. | |
| 2018/0031964 A1* | 2/2018 | Jindal | G03F 1/24 |
| 2018/0299766 A1* | 10/2018 | Tanabe | G03F 1/24 |

* cited by examiner

PATTERNING DEVICE

CROSS-REFERENCE TO RELATED PATENT APPLICATIONS

This application claims priority to International Application No. PCT/EP2018/061122, filed May 2, 2018, which claims priority of EP application no. 17173891.7, which was filed on 1 Jun. 2017. The entire contents of the above-referenced applications are expressly incorporated herein by reference.

FIELD

The embodiments of the present disclosure relate to a patterning device for use with a lithographic apparatus and a method of manufacture of the patterning device.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

The patterning device may be provided in the form of a binary mask, which includes a substrate with a reflecting portion and an absorbing portion on the top. The absorbing portion may comprise a thickness of about 60 to 70 nm. This thickness of the absorbing portion may be problematic for the performance of the lithographic apparatus. A size of the features to be imaged may be small relative to the thickness of the absorbing portion, which may result in complex 3-dimensional diffraction or shadowing effects. For example, due to the angle of incidence of the EUV radiation on the patterning device, which may be non-zero, large differences in horizontal and vertical lines, so-called H-V differences, may be observed on the substrate. Additionally, the absorbing portion may introduce non-telecentricity to the radiation projected by the patterning device.

SUMMARY

According to some embodiments of the disclosure, a patterning device is provided for use with a lithographic apparatus, the device comprising an absorber portion configured to absorb incident radiation and to reflect a portion of incident radiation, the absorber portion comprising a first layer and a second layer, the first layer of the absorber portion comprising a first material that is different from a second material of the second layer of the absorber portion; a reflector portion arranged beneath the absorber portion, the reflector portion being configured to reflect incident radiation; and a phase tune portion arranged between the reflector portion and the absorber portion, the phase tune portion being configured to induce a phase shift between the radiation reflected by the reflector portion and the portion of radiation reflected by the absorber portion such that the radiation reflected by the reflector portion destructively interferes with the portion of radiation reflected by the absorber portion.

By providing an absorber portion with a first layer comprising a first material that is different from a second material of the second layer, a reflectivity of the absorber portion may be varied. This may allow a thickness of the absorber portion to be reduced relative to an absorber portion comprising a single material.

The phase tune portion may comprise a material and/or a thickness selected such that the phase shift induced by the phase tune portion may cause destructive interference between the radiation reflected by the reflector portion and the portion of radiation reflected by the absorber portion.

The first material may comprise one or more optical properties that are different from one or more properties of the second material.

The first and second materials may be selected such that a reflectivity of the absorber portion may be lower than a reflectivity of the reflector portion.

The first and second materials may be selected such that the absorber portion may comprise a reflectivity in a range of about 1 to 20%.

The first and second materials may be selected such that a thickness of the absorber portion may be equal to or less than 25 nm or 30 nm. By selecting the first and second materials such that a thickness of the absorber portion may be equal to or less than 25 nm or 30 nm, shadowing effect or non-telecentricity effects may be reduced, which may lead to an improved performance of a/the lithographic apparatus.

The absorber portion may comprise a plurality of first layers and/or a plurality of second layers.

A/each first layer of the plurality of first layers may be alternately arranged with a/each second layer of the plurality of second layers.

The/each first layer and the/each second layer may be arranged such that the portion of radiation reflected by the absorber portion may be in phase, e.g. substantially in phase, or comprises a single phase.

The first material of the/each first layer may comprise a refractive index and/or absorption coefficient that may be higher than a refractive index and/or absorption coefficient of the second material of the/each second layer.

A number of first and second layers may be selected to provide a pre-determined reflectivity of the absorber portion.

The first and second materials and/or a ratio of a thickness of the first layer to a thickness the second layer may be selected to provide a pre-determined reflectivity.

The phase tune portion may comprise a material that is the same as the first material of the/each first layer or the second material of the/each second layer or a material of the reflector portion. This may facilitate manufacture of the patterning device.

The phase tune portion may comprise a material that is different from the first material of the/each first layer and/or the second material of the/each second layer.

The absorber may comprise a third layer and a fourth layer.

One of the third layer or fourth layer may be arranged on one of the first layer or second layer. The other one of the third layer or fourth layer may be arranged on the one of the third or fourth layer that is arranged on the one of the first layer or second layer.

The first layer and/or fourth layer may comprise at least one of Silver, Tantalum, Tantalum-Nitride and Nickel.

The second layer and/or third layer may comprise at least one of Aluminium and Silicon.

By providing the absorber portion with a third layer and/or a fourth layer, as described above, one or more properties of the patterning device, e.g. the absorber portion, may be adjusted. For example, the provision of the third and/or fourth layers of the absorber portion may improve a stability/performance of the patterning device under a load exerted on the patterning device by radiation and/or a hydrogen environment of the lithographic apparatus. The provision of the third and/or fourth layers may facilitate cleaning and/or inspection of the patterning device, such as for example deep ultraviolet inspection.

The phase tune portion may comprise at least one of Ruthenium, Silicon and Molybdenum.

The absorber portion may be arranged on the phase tune portion and/or reflector portion to form a pattern that is to be projected on a substrate by a lithographic apparatus.

The patterning device may be provided for use with radiation comprising a wavelength of about 13.5 nm or about 6.7 nm.

According to some embodiments of the disclosure, a method of manufacture of a patterning device is provided for use with a lithographic apparatus, the method comprising forming a reflector portion, the reflector portion being configured to reflect incident radiation; forming an absorber portion, the absorber portion being configured to absorb incident radiation and to reflect a portion of incident radiation, wherein the reflector portion is formed beneath the absorber portion, the absorber portion comprising a first layer and a second layer, the first layer comprising a first material that is different from a second material of the second layer; and forming a phase tune portion between the reflector portion and the absorber portion, the phase tune portion being configured to induce a phase shift between the radiation reflected by the reflector portion and the portion of radiation reflected by the absorber portion such that the radiation reflected by the reflector portion destructively interferes with the portion of radiation reflected by the absorber portion.

According to some embodiments of the disclosure, a use of the patterning device is provided.

According to some embodiments of the disclosure, a method comprising projecting a patterned beam of radiation onto a substrate is provided, wherein the beam of radiation is patterned by the patterning device.

Various aspects and features of the embodiments of the disclosure out above or below may be combined with various other aspects and features of the embodiments as will be readily apparent to the skilled person.

BRIEF DESCRIPTION OF THE DRAWINGS

Embodiments of the present disclosure will now be described, by way of example only, with reference to the accompanying schematic drawings, in which.

DETAILED DESCRIPTION

Figure 1:
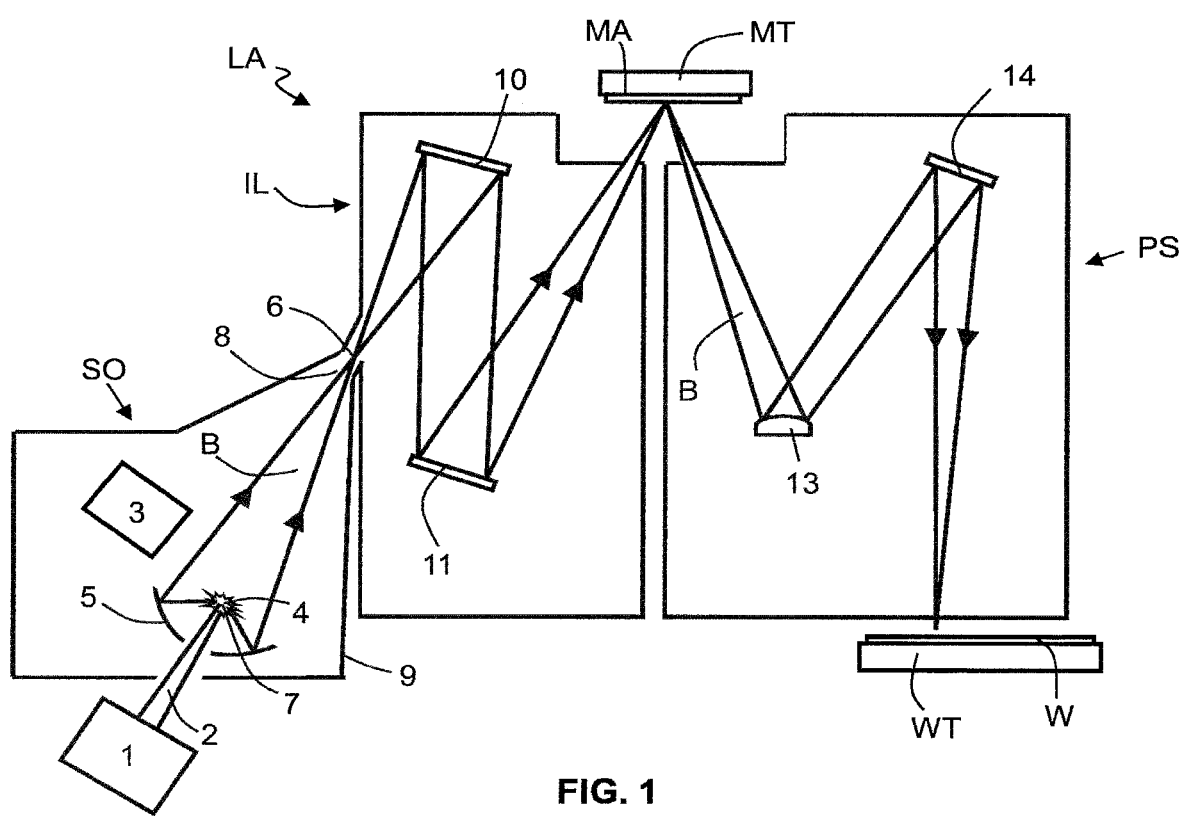
FIG. 1 depicts a lithographic system comprising a lithographic apparatus and a patterning device according to some embodiments of the disclosure.

FIG. 1 shows a lithographic system including a patterning device MA according to some embodiments of the disclosure. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support the patterning device MA, a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two ellipse focal points. A first focal point may be at the plasma formation region 4, and a second focal point may be at an intermediate focus 6, as discussed below.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular intensity distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2:
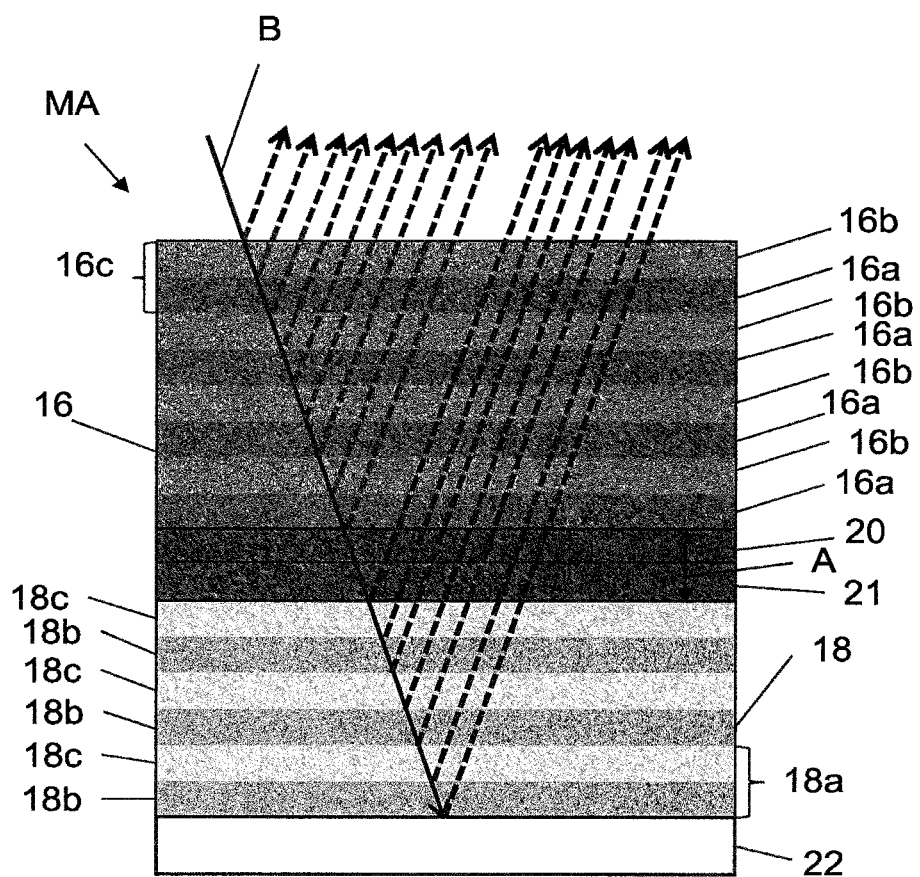
FIG. 2 schematically depicts a patterning device according to some embodiments of the disclosure.

FIG. 2 schematically depicts a patterning device MA for use with a lithographic apparatus according to some embodiments of the disclosure. The patterning device MA may be provided in the form of a mask MA, such as for example an EUV mask. The mask MA comprises an absorber portion 16 configured to absorb incident radiation B and to reflect a portion of incident radiation. The mask MA comprises a reflector portion 18 arranged beneath the absorber portion 16. The reflector portion 18 is configured to reflect incident radiation. The mask MA may comprise a phase tune portion 20 arranged between the reflector portion 18 and the absorber portion 16. The phase tune portion 20 is then configured to induce a phase shift between the radiation reflected by the reflector portion 18 and the portion of radiation reflected by the absorber portion 16 such that the radiation reflected by the reflector portion 18 destructively interferes with the portion of radiation reflected by the absorber portion 16. The provision of the phase tune portion 20 may allow for a reduction in the thickness of the absorber portion 20. This in turn may reduce shadowing effects and/or non-telecentricity effects.

The term "radiation" may be considered as encompassing at least a portion of or all of the radiation beam. The term "radiation" may be interchangeably used with the term "radiation beam."

The phase shift induced by the phase tune portion may be or comprise a 180° phase shift. The radiation reflected by the reflector portion 18 may pass through the phase tune portion 20 and the absorber portion 16, for example before destructively interfering with the portion of radiation reflected by the absorber portion 16.

The reflector portion 18 may comprise a multilayer structure. The reflector portion 18 may comprise a plurality of layers. The reflector portion may comprise a plurality of pairs of layers 18a. Each pair of layers 18a comprises a first layer 18b comprising a first material and a second layer 18c comprising a second material. The first material of the first layer 18b may be different from the second material of the second layer 18c. The first material may comprise one or more optical properties that are different from one or more properties of the second material. For example, the first material may comprise a refractive index and/or absorption coefficient that is lower than a refractive index and/or absorption coefficient of the second material. The first material may be considered as comprising an optical impedance that is lower than an optical impedance of the second material. By providing the reflector portion with a first layer comprising a first material that is different from a second material of the second layer, a reflectivity of the reflector portion may be varied. The pairs 18a of layers are arranged on top of each other so that the first and second layers 18b, 18c are alternately arranged. The first material may comprise Silicon and/or Beryllium. The second material may comprise Molybdenum and/or Ruthenium. In embodiments where the first material comprises Silicon and the second material comprises Molybdenum, the reflector portion 18 may comprise a reflectivity of about 70%.

The reflector portion 18 may be arranged on a substrate 22, which may comprise a glass substrate.

The phase tune portion 20 may comprise a material selected such that the phase shift induced by the phase tune portion causes destructive interference between the radiation reflected by the reflector portion 18 and the portion of radiation reflected by the absorber portion 16. The phase tune portion 20 may comprise Silicon. It will be appreciated that the phase tune portion disclosed herein is not limited to comprising Silicon and that in other embodiments one or more other material may be used. For example, in other embodiments the phase tune portion may comprise Molybdenum and/or Ruthenium.

The mask MA may comprise a protective layer 21. The protective layer 21 may be considered as a neutral layer. In other words, the protective layer 21 may allow an order of the layers, e.g. first and second layers 18b, 18c, of the reflector portion 18 and/or an order of one or more layers of the absorber portion 16 (which will be described below) to be changed or varied. This may allow the phase between the radiation reflected by the reflector portion 18 and the portion of radiation reflected by the absorber portion 16 to be tuned or varied, for example such that the radiation reflected by the reflector portion 18 destructively interferes with the portion of radiation reflected by the absorber portion 16. The protective layer 21 may be arranged on the reflector portion 18, such as between the reflecting portion 18 and the phase tune portion 20. The protective layer may be considered as a capping layer of the reflector portion 18. The protective layer 21 may comprise a material that is chemically stable. For example, the protective layer 21 may comprise Ruthenium.

The protective layer 21 may be considered to be part of the phase tune portion 20. For example, the protective layer 21 may comprise a material selected such that the phase shift induced by the phase tune portion 20 causes destructive interference between radiation reflected by the reflector portion 18 and the portion of radiation reflected by the absorber portion 16. In other words, one or more optical properties of the protective layer 21 may be considered when selecting the material of the phase tune portion 20.

Although FIG. 2 depicts the protective layer 21 as being arranged between the reflector portion 18 and the phase tune portion 20, it will be appreciated that in other embodiments the protective layer may define or comprise the phase tune portion. In other words, the protective layer may be configured to induce a phase shift between the radiation reflected by the reflector portion and the portion of radiation reflected by the absorber portion such that the radiation reflected by the reflector portion destructively interferes with the portion of radiation reflected by the absorber portion. In examples, where the protective layer comprises Ruthenium, a thickness of the protective layer may be increased relative to a thickness of the protective layer in examples, where a phase tune portion is provided in addition to the protective layer.

The phase tune portion 20 may comprise a thickness A selected such that the phase shift induced by the phase tune portion 20 causes destructive interference between the radiation reflected by the reflector portion 18 and the portion of radiation reflected by the absorber portion 16. In embodiments where the mask MA comprises the phase tune portion 20 and the protective layer 21, a thickness of the phase tune portion 20 may be in the range of about 2 to 5 nm. The protective layer 21 may comprise a thickness of about 2 to 5 nm. At a thickness of about 2 to 5 nm absorption of the protective layer 21 may be considered to be reduced, low or negligible. It will be appreciated that the protective layer disclosed herein is not limited to comprising a thickness of about 2 to 5 nm and that in other embodiments the protective layer may comprise a thickness that is larger or lower than 2 to 5 nm. For example in embodiments where the protective layer defines the phase tune portion, a thickness of the protective layer 21 may be larger than 2 to 5 nm.

The absorber portion 16 may comprise a multilayer absorber. For example, the absorber portion 16 comprises a first layer 16a and a second layer 16b. The first layer 16a of the absorber portion comprises a first material that is different from a second material of the second layer 16b. The first material may comprise one or more optical properties that are different from one or more properties of the second material. For example, the first material may comprise a refractive index and/or absorption coefficient that is higher than a refractive index and/or absorption coefficient of the second material. The first material may be considered as comprising an optical impedance that is higher than an optical impedance of the second material. By providing an absorber portion with a first layer comprising a first material that is different from a second material of the second layer, a reflectivity of the absorber portion may be varied. Additionally, a thickness of the absorber portion may be reduced relative to an absorber portion comprising a single material.

The first and second materials may be selected such that a reflectivity of the absorber portion is lower than a reflectivity of the reflector portion. For example, the first and second materials may be selected such that the reflectivity of the absorber portion is a fraction, such as a well-defined fraction, of the reflectivity of the reflector portion. The first and second materials may be selected such that the absorber portion 16 comprises a reflectivity in a range of about 1 to 20%, such as for example 5 to 15%. The first and second materials may be selected based on one or more optical properties of the first and second materials. For example, the first and second materials may be selected so that there is an optical contrast or difference between the first and second layers 16a, 16b. The optical contrast or difference between the first and second materials may also determine the reflectivity of the absorber portion 16. For example, the first and second materials may be selected such that there is a difference between the refractive index, e.g. the real part and/or the imaginary part of the refractive index, of the first and second materials.

The selection of the first and second materials of the first and second layers 16a, 16b may allow the reflectivity of the absorber portion 16 to be varied or tuned, as will be explained below. The first and second materials can be selected such that a thickness of the absorber portion 16 is equal to or less than 25 nm or 30 nm. For example, the first and second material may be selected such that a thickness of the absorber portion is in the range of about 10 to 25 nm, while the resulting reflectivity of the absorber portion is in the range of 1 to 20%. By providing a mask with an absorber portion comprising a thickness of equal to or less than 25 nm or 30 nm, shadowing effect or non-telecentricity effects may be reduced, which may lead to an improved performance of the lithographic apparatus.

As depicted in FIG. 2, the absorber portion 16 may comprise a plurality of first layers 16a and a plurality of second layers 16b. Each first layer of the plurality of first layers is alternately arranged with each second layer 16b of the plurality of second layers. The/each first and second layers 16a, 16b may form a pair of layers 16c. In the example depicted in FIG. 2, four pair of layers 16c are arranged on top of each other. It will be appreciated that in other embodiments the absorber portion 16 may comprise more or less than four pairs of layers. For example, as will be explained below, the number of pairs of layers may be decreased or increased to vary or tune the reflectivity of the absorber portion 16.

The/each first layer 16a and the/each second layer 16b may be arranged such that the portion of radiation reflected by the absorber portion 16 is in phase or comprises a single phase. A sum of a thickness of the first layer and a thickness of the second layer may correspond to a multiple N of about a half of a wavelength $\lambda$ of the radiation (e.g. $\lambda/2*N$, wherein N=1, 2, 3 . . . ). For example, in embodiments where the radiation comprises a wavelength 2 of 13.5 nm, the sum of the thickness of the first and second layers 16a, 16h may be about 7 nm or multiples N of 7 nm (e.g. 7 nm*N). It will be appreciated that in other embodiments, the radiation may comprise a wavelength of about 6.7 nm. In such embodiments, a sum of the thickness of the first and second layers may be about 3 nm or multiples N of 3 nm (e.g. 3 nm*N). It will be appreciated that an exact thickness of each or both of the first and second layers may depend on a phase shift, which is introduced to the radiation at an interface between the first and second layers.

The/each first layer 16a and the/each second layer 16b may be arranged such that the portion of radiation reflected by the absorber portion 16 is reflected at least at an interface between the/each first layer 16a and the/each second layer 16b. A remainder of the incident radiation may be absorbed by the absorber portion 16. The absorber portion 16 may be configured to comprise an absorbance of about 85 to 95%, such as for example about 98%. In the example depicted in FIG. 2, the first material of the first layer 16a comprises Silver and the second material of the second layer 16b comprises Aluminium. In the example of FIG. 2, the second layer 16b comprising the second material is arranged on the phase tune portion 20, followed by the first layer 16a comprising the first material. It will be appreciated that in other embodiments, the first layer comprising the first material may be arranged on the phase tune portion.

Figure 3:
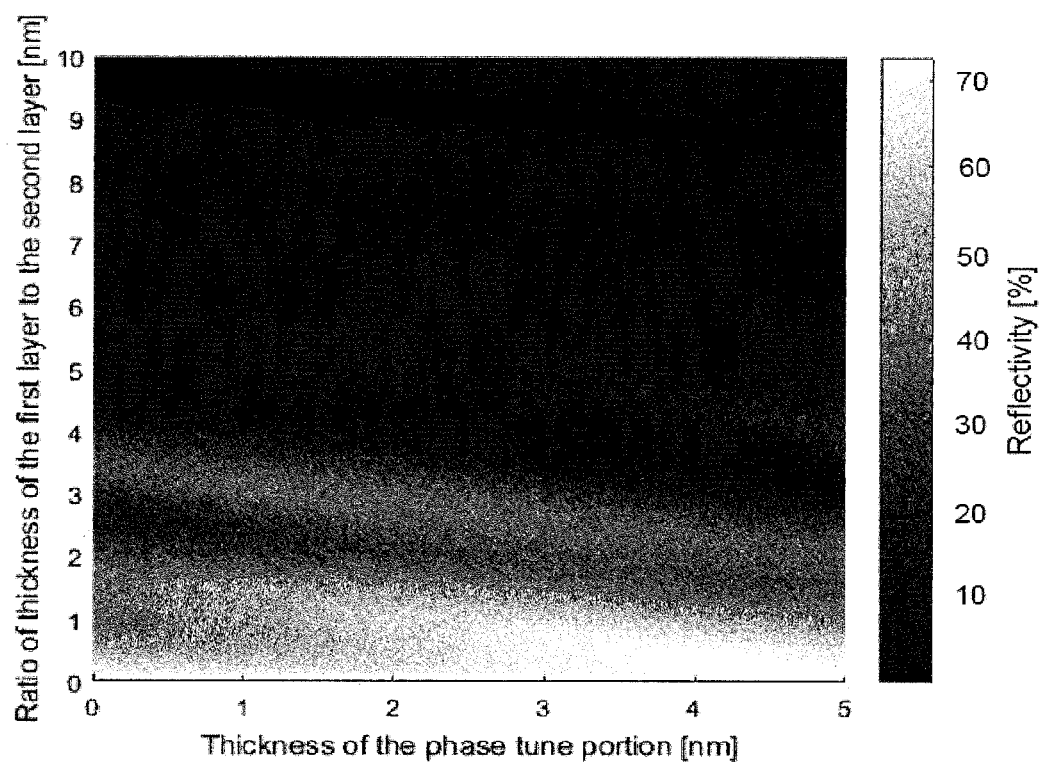
FIG. 3 depicts a map of the reflectivity of an absorber portion of a patterning device according to some embodiments of the disclosure.

FIG. 3 depicts a map of a simulated reflectivity of the absorber portion 16 in dependence of a thickness of the phase tune portion 20, which in this example comprises Silicon, and a ratio between a thickness of the first layer 16a and a thickness the second layer 16b. The reflectivity of the absorber portion 16 was obtained for an absorber portion in which the first material of the first layer 16a comprises Silver and the second material of the second layer 16b comprises Aluminium. It can be seen from FIG. 3 that by increasing the thickness of the first layer 16a relative to the thickness of the second layer 16b, the reflectivity of the absorber portion 16 decreases and/or by decreasing the thickness of the first layer 16a relative to the thickness of the second layer 16b, the reflectivity of the absorber portion 16 increases. This can be due to the material of the first layer 16a having a higher absorption coefficient than the material of the second layer 16b. However, it will be appreciated that the material of the first layer is not limited to having a higher absorption coefficient than the material of the second layer. For examples, it should be understood that an increase or decrease of the thickness of the first layer relative to the thickness of the second layer may cause an increase or decrease of the absorbance of the first layer relative to the absorbance of the second layer.

A variation in the thickness of the of the phase tune portion 20 causes a variation in the reflectivity of the absorber portion. For example as depicted in FIG. 3, an increase in the thickness of the phase tune portion 20 may lead to an increase in the reflectivity of the absorber portion 16. The thickness of the phase tune portion 20 may be varied instead of or in addition to varying the thickness of the first and/or second layers 16a, 16b. By varying the thickness of the first and/or second layers 16a, 16b of the absorber portion 16 and/or the thickness of the phase tune portion 20, the reflectivity of the absorber portion 16 may be tuned or varied. For example, the thickness of the first and/or second layers 16a, 16b of the absorber portion 16 and/or the thickness of the phase tune portion 20 may be selected to provide a pre-determined or desired reflectivity of the absorber portion 16. In other words, a ratio of the thickness of the first material to the thickness of the second material may be selected to provide the pre-determined or desired reflectivity.

Figure 4:
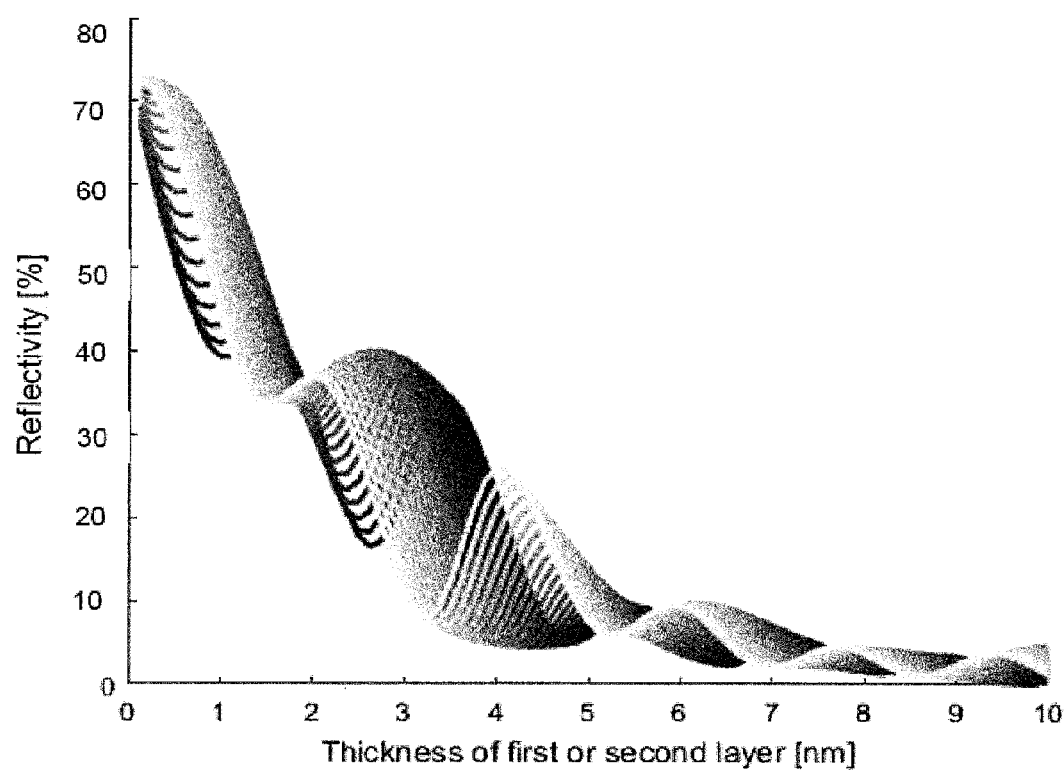
FIG. 4 depicts a graph of the reflectivity of the absorber portion of a patterning device according to some embodiments of the disclosure.

FIG. 4 depicts a graph of the simulated reflectivity of the absorber portion 16 described in relation to FIG. 3 in dependence on the thickness of the first layer 16a or the second layer 16b. Each line depicted in FIG. 4 corresponds to a configuration of the phase tune portion 20, e.g. a thickness of the phase tune portion 20. The thickness of the phase tune portion 20 was varied between about 0 nm and 5 nm in the graph depicted in FIG. 4. By decreasing the thickness of the first layer 16a or the thickness of the second layer 16b, the reflectivity of the absorber portion 16 increases, while an increase in the thickness of the first layer 16a or the thickness of the second layer 16b causes a decrease of the reflectivity of the absorber portion 16. The decrease or increase of the thickness of the first layer 16a or the thickness of the second layer 16b may cause a relative decrease or increase in the absorbance of the first layer 16a or of the second layer 16b, as described above. For example, in embodiments in which the absorber portion 16 comprises two pairs of layers 16c, each first layer 16a comprises Silver, each second layer 16b comprises Aluminium, and each of the first and second layers have a thickness of about 3.5 nm, the reflectivity of the absorber portion 16 is about 10%. The absorber portion 16 in these embodiments has a thickness of about 14 nm, while a thickness of the phase tune portion 20 is about 5 nm.

Figure 5:
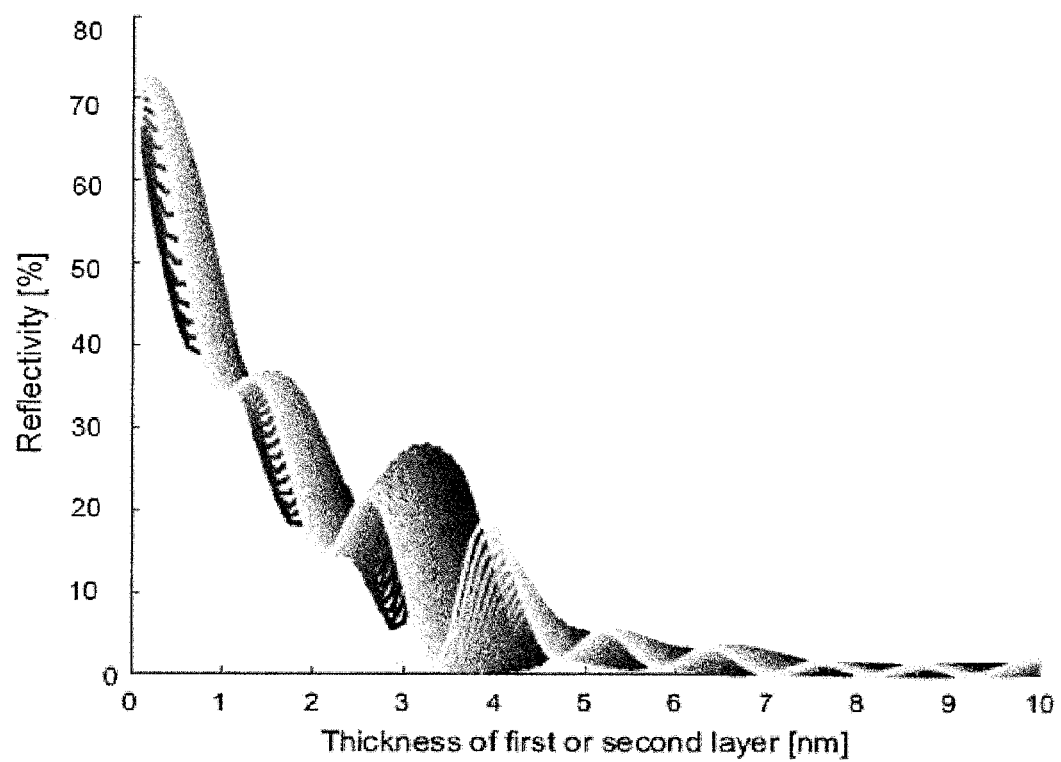
FIG. 5 depicts a graph of the reflectivity of the absorber portion of a patterning device according to some embodiments of the disclosure.

It will be appreciated that a number of the first and second layer 16a, 16b, e.g. a number of the pairs of layers 16c, may be varied to tune or vary the reflectivity of the absorber portion 16. FIG. 5 depicts another graph of the simulated reflectivity of the absorber portion 16 in dependence on the thickness of the first layer 16a or the second layer 16b. In FIG. 5 the simulated reflectivity is depicted for an absorber portion similar to that described above in relation to FIG. 3. However, FIG. 5 depicts the simulated reflectivity for an absorber portion 16 comprising three pairs of layers 16c, e.g. three first layers 16a and three second layers 16b. From FIG. 5, it can be seen that the reflectivity of the absorber portion 16 is decreased for an absorber portion 16 comprising three pairs of layers 16c compared to an absorber portion 16 comprising two pairs of layer 16c. For example, at a thickness of 3.5 nm of the first layer 16a or the second layer 16a, the reflectivity of the absorber portion 16 is decreased to almost 0%. A number of first and second layers 16a, 16b may be selected to provide a pre-determined or desired reflectivity of the absorber portion 16.

Figure 6:
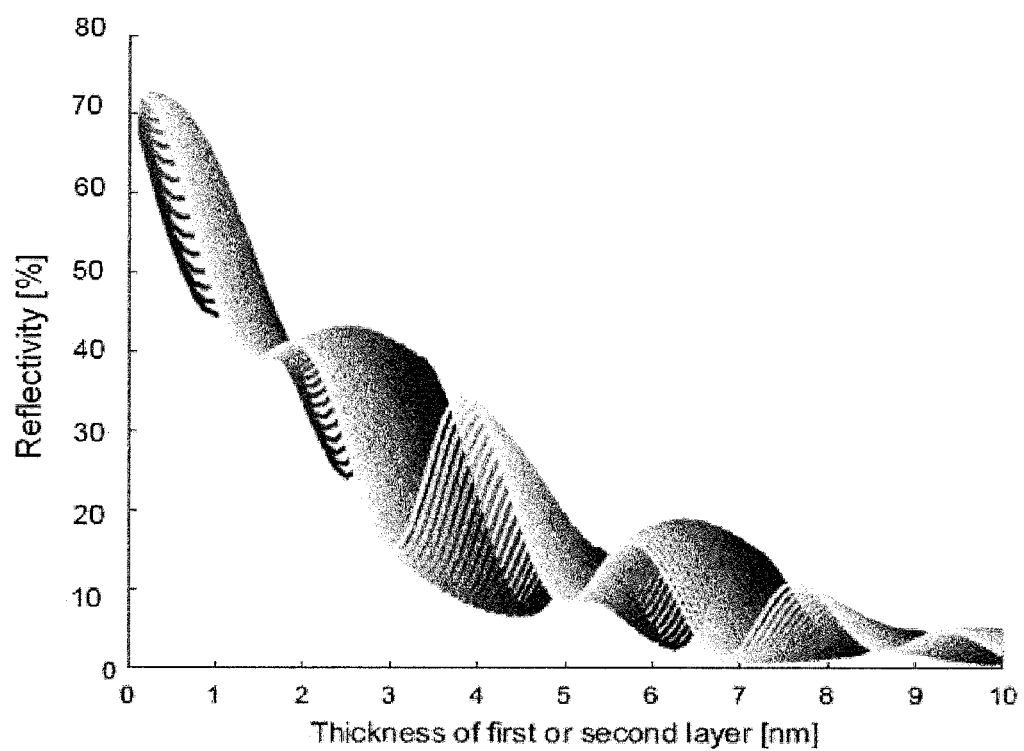
FIG. 6 depicts a graph of the reflectivity of the absorber portion of a patterning device according to some embodiments of the disclosure.

FIG. 6 depicts another graph of the simulated reflectivity of the absorber portion 16 in dependence on the thickness of the first layer 16a or the second layer 16b. In FIG. 6 the simulated reflectivity is depicted for an absorber portion similar to that described above in relation to FIG. 4. However, the ratio of a thickness of the first layer 16a to a thickness of the second layer 16h is about 1:2. In other words, the thickness of the second layer 16h is about twice the thickness of the first layer 16a. As can be seen in FIG. 6, an increase of the thickness of the second layer 16b causes an increase of the reflectivity of the absorber portion 16. For example, at a thickness of 3.5 nm of the first layer 16a or the second layer 16b, the reflectivity of the absorber portion is larger than 10%.

FIGS. 3 to 6 relate to embodiments of an absorber portion 16, which comprises Silver as the first material of the first layer 16a and Aluminium as the second material of the second layer 16b. It will be appreciated that the absorber portion described herein is not limited to comprising a first layer comprising Silver and a second layer comprising Aluminium. The first and second materials of the first and second layers may be selected to provide a pre-determined or desired reflectivity, such as for example a pre-determined or desired reflectivity of about 5 to 15%. For example, in other embodiments the first material of the first layer comprises Tantalum or Tantalum-Nitride and/or the second material of the second layer may comprise Silicon. Tantalum, Tantalum-Nitride and/or Silicon comprise an absorption coefficient that is smaller than an absorption coefficient of Silver. By providing Tantalum or Tantalum-Nitride as a first material of the first layer and/or Silicon as a second material of the second layer, the reflectivity of the absorber portion may be increased relative to an absorber portion comprising Silver as the first material of the first layer and Aluminium as a second material of the second layer. An absorber portion 16 comprising Tantalum or Tantalum- Nitride as the first material of the first layer 16a and/or Silicon as a second material of the second layer 16b may comprise a reflectivity of larger than 2% and below 20%. The reflectivity of the absorber portion 16 may be varied by varying the number of pairs 16c of the first and second layers 16a, 16b and/or the thickness of the first layer 16a relative to the thickness of the second layer 16b.

Figure 7:
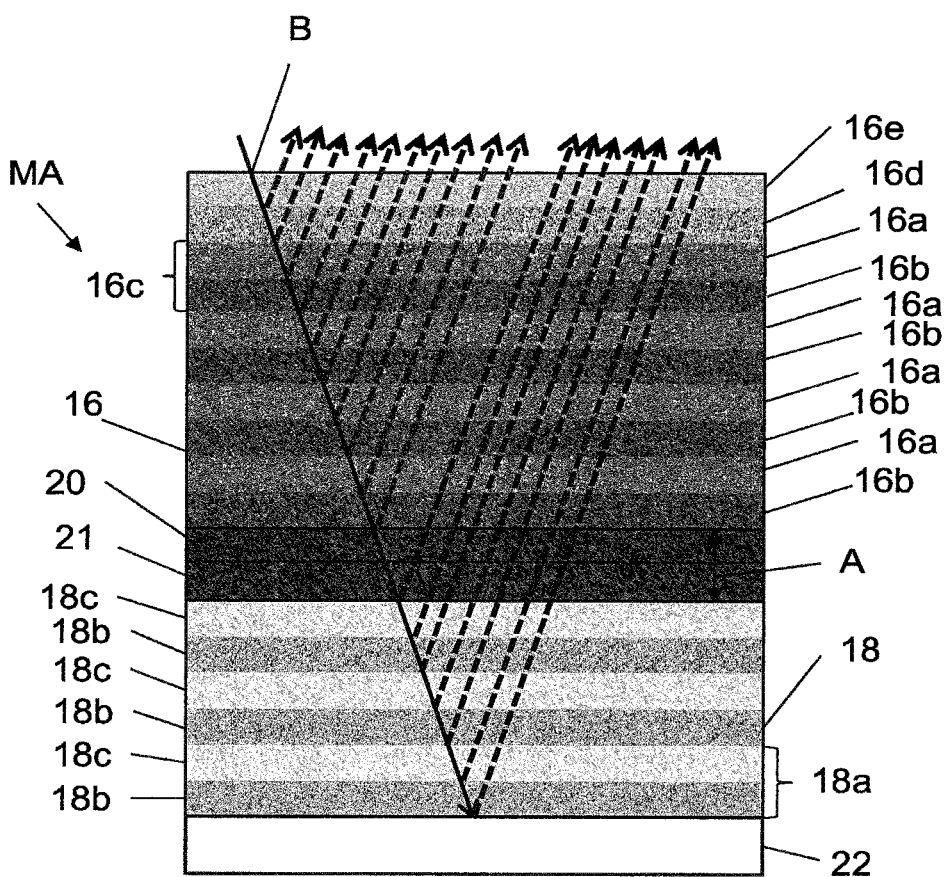
FIG. 7 schematically depicts a patterning device according to some embodiments of the disclosure.

FIG. 7 depicts another example of a mask MA for use with a lithographic apparatus. The mask MA depicted in FIG. 7 is similar to that depicted in FIG. 2. In the embodiment depicted in FIG. 7 the first material of the first layer 16a may comprise Silver and the second material of the second layer 16b may comprise Silicon. In the embodiment depicted in FIG. 7, the first layer 16a is arranged on the phase tune portion 20 followed by the second layer 16b.

In the example depicted in FIG. 7 the absorber portion 16 additionally comprises a third layer 16d and a fourth layer 16e. The third layer 16d and fourth layer 16e may each comprise a material that is different from the first material of the first layer 16a and a second material of the second layer 16b. For example, the third material of the third layer 16d may comprise Aluminium and the fourth material of the fourth layer 16e may comprise Tantalum-Nitride. In the example depicted in FIG. 7, the third layer 16d is arranged on the first layer 16a and the fourth layer 16e is arranged on the third layer 16d. It should be understood that the absorber portion disclosed herein is not limited to such arrangement of the third and fourth layers. For example, in other embodiments, the fourth layer may be arranged on the first layer or one of the third and fourth layers may be arranged on the second layer, while the other of the third and fourth layers is arranged on the one of the third and fourth layers arranged on the second layer. By providing the absorber portion 16 with a third layer and/or a fourth layer, one or more properties of the patterning device, e.g. the absorber portion, may be adjusted. For example, the provision of the third and/or fourth layers of the absorber portion may improve a stability/performance of the mask under a load exerted on the mask by radiation and/or a hydrogen environment of the lithographic apparatus. The provision of the third and/or fourth layers may facilitate cleaning and/or inspection of the mask, such as for example deep ultraviolet inspection.

Figure 8:
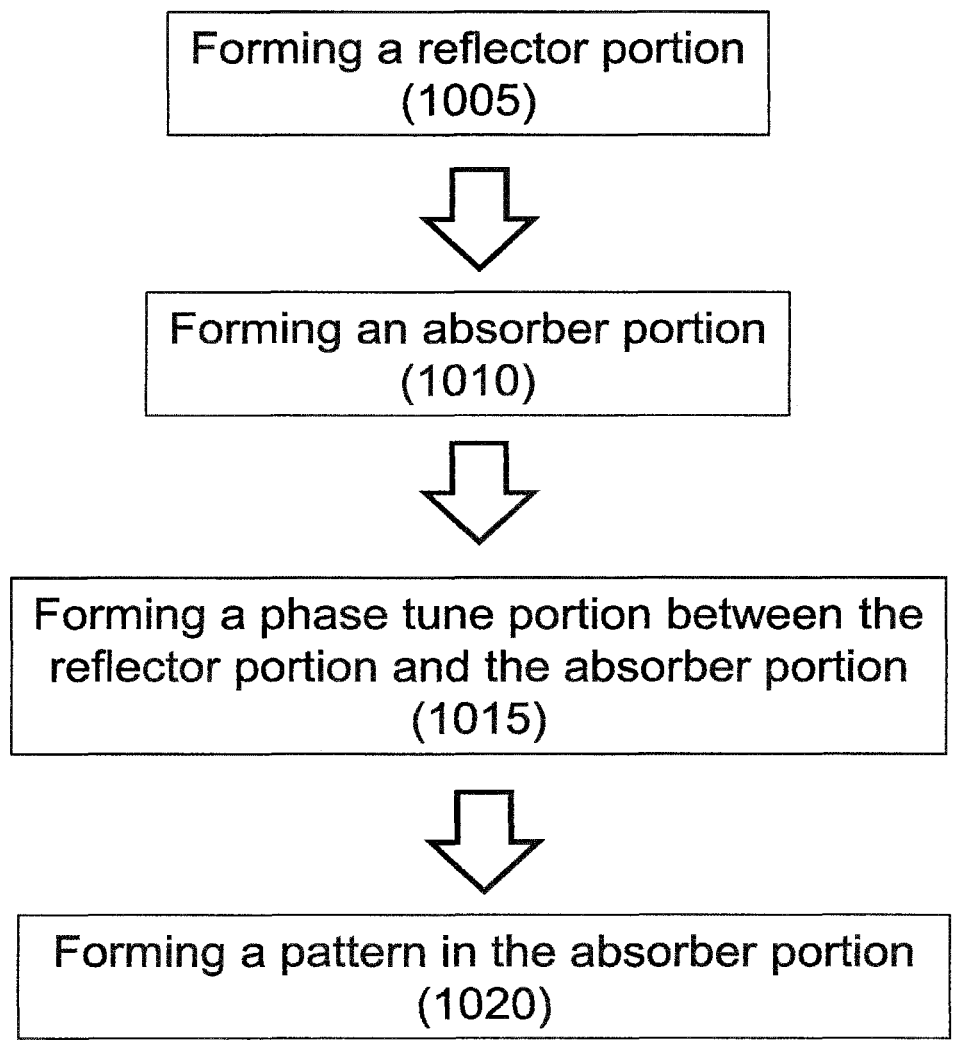
FIG. 8 depicts a flowchart of a method of manufacturing a patterning device according to some embodiments of the disclosure.

FIG. 8 depicts a flow chart of a method of manufacture of the mask MA depicted in FIG. 2 or 7. The method comprises forming the reflector portion 18 (Step 1005). As described above, the reflector portion 18 is configured to reflect incident radiation B. The method comprises forming the absorber portion 16. The absorber portion 16 is configured to absorb incident radiation B and to reflect a portion of incident radiation B (Step 1010). The reflector portion 18 is formed beneath the absorber portion 16. As described above, the absorber portion 16 comprises a first layer 16a and a second layer 16b. The first layer 16a of the absorber portion comprises a first material that is different from a second material of the second layer 16b. The absorber portion 16 may be formed as a multilayer absorber portion. The method comprises forming the phase tune portion 20 between the reflector portion and the absorber portion (Step 1015). The phase tune portion 20 is configured to induce a phase shift between the radiation reflected by the reflector portion 18 and the portion of radiation reflected by the absorber portion 16 such that the radiation reflected by the reflector portion 18 destructively interferes with the portion of radiation reflected by the absorber portion 16.

The reflector portion 18 may be formed on a substrate, such as for example a glass substrate. The absorber portion 16, the reflector portion 18 and/or the phase tune portion 20 may be formed by one or more deposition methods, such as for example Chemical Vapour Deposition.

The absorber portion 16 may be arranged on the phase tune portion 20 and/or reflector portion 18. The method may comprises forming a pattern in the absorber portion 16 (Step 1020). The formed pattern in the absorber portion 16 may be projected on a substrate by the lithographic apparatus LA. For example, a radiation sensitive material, e.g. a resist or photo resist, may be applied to the absorber portion 16. The pattern may be exposed on the absorber portion 16. The exposed areas of the absorber portion 16 may be removed, for example by etching the absorber layer 16.

Although the phase tune portion 20 was described as comprising a material, e.g. Ruthenium, that is different from the first material of the/each first layer and/or the second material of the/each second layer of the absorber portion 16, it will be appreciated that in other embodiments the phase tune portion may comprise a material that is the same as the first material of the first layer or the second material of the second layer of the absorber portion 16 or the reflector portion 18. For example, the first layer of the phase tune portion 20, which may comprise Ruthenium, may be considered as a cap portion of the reflector portion 18. The cap portion may become part of the absorber portion 16, for example, when a thickness of at least one layer of the reflector portion 18, such as for example the top or last layer of the reflector portion 18, is increased or decreased. The at least one layer of the reflector portion may then define the phase tune portion 20 (or at least part thereof). The at least one layer of the reflector portion may comprise Silicon. In other words, the phase tune portion may be provided by one or more layers adjacent to the cap portion. This may facilitate manufacture of the mask MA.

Although specific reference may be made in this text to embodiments of the disclosure in the context of a lithographic apparatus, embodiments of the present disclosure may be used in other apparatus. Embodiments of the disclosure may be used in a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm. The mask MA may be provided for use with EUV radiation comprising a wavelength in the range of 13-14 nm, such as for example 13.5 nm, or in the range of 4-10 nm, such as for example 6.7 nm or 6.8 nm.

Although FIG. 1 depict the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the present disclosure have been described above, it will be appreciated that these embodiments may be practiced otherwise than as described. The descriptions above are intended to be illustrative, not limiting. Thus, it will be apparent to one skilled in the art that modifications may be made to the disclosed embodiments as described without departing from the scope of the claims set out below.

The invention claimed is:

1. A patterning device for use with a lithographic apparatus, the device comprising:
    an absorber portion configured to absorb incident radiation and to reflect a portion of incident radiation, the absorber portion comprising a first layer and a second layer, the first layer of the absorber portion comprising a first material that is different from a second material of the second layer of the absorber portion,
    a reflector portion arranged beneath the absorber portion, the reflector portion being configured to reflect incident radiation that passed through the absorber portion; and
    a phase tune portion arranged between the reflector portion and the absorber portion, the phase tune portion being configured to induce a phase shift between the radiation reflected by the reflector portion and the portion of radiation reflected by the absorber portion such that the incident radiation reflected by the reflector portion destructively interferes with the portion of radiation reflected by the absorber portion.

2. The device of claim 1, wherein the phase tune portion comprises a material and/or a thickness selected such that the phase shift induced by the phase tune portion causes destructive interference between the radiation reflected by the reflector portion and the portion of radiation reflected by the absorber portion.

3. The device of claim 1, wherein the first and second materials are selected such that the absorber portion comprises a reflectivity in a range of about 1 to 20%.

4. The device of claim 1, wherein the first and second materials are selected such that a thickness of the absorber portion is equal to or less than 25 nm or 30 nm.

5. The device of claim 1, wherein the absorber portion comprises a plurality of first layers and a plurality of second layers.

6. The device of claim 1, wherein the/each first layer and the/each second layer are arranged such that the portion of radiation reflected by the absorber portion is in phase or comprises a single phase.

7. The device of claim 1, wherein the first material of the/each first layer comprises a refractive index and/or absorption coefficient that is higher than a refractive index and/or absorption coefficient of the second material of the/each second layer, wherein the phase tune portion comprises a material that is different from the first material of the/each first layer and/or the second material of the/each second layer.

8. The device of claim 1, wherein the first and second materials and/or a ratio of a thickness of the first layer to a thickness of the second layer is selected to provide a pre-determined reflectivity.

9. The device of claim 1, wherein the phase tune portion comprises a material that is the same as the first material of the/each first layer or the second material of the/each second layer or a material of the reflector portion.

10. The device of claim 1, wherein the phase tune portion comprises a material that is different from the first material of the/each first layer and/or the second material of the/each second layer.

11. The device according to claim 1, wherein the absorber comprises a third layer and a fourth layer.

12. The device according to claim 11, wherein one of the third layer or fourth layer is arranged on one of the first layer or second layer and the other one of the third layer or fourth layer is arranged on the one of the third or fourth layer that is arranged on the one of the first layer or second layer.

13. The device according to claim 11, wherein the first layer and/or fourth layer comprises at least one of Silver, Tantalum, Tantalum-Nitride and Nickel.

14. The device according to claim 11, wherein the second layer and/or third layer comprises at least one of Aluminum and Silicon.

15. The device of claim 1, wherein the phase tune portion com the phase tune portion comprises at least one of Ruthenium, Silicon and Molybdenum.

16. The device of claim 1, wherein the absorber portion is arranged on the phase tune portion and/or reflector portion to form a pattern that is to be projected on a substrate by a lithographic apparatus.

17. The device of claim 1, wherein the device is provided for use with radiation comprising a wavelength of about 13.5 nm or about 6.7 nm.

18. Use of a patterning device of claim 1 with a lithographic apparatus.

19. A method comprising projecting a patterned beam of radiation onto a substrate, wherein the beam of radiation is patterned by a patterning device according to claim 1.

20. A method of manufacture of a patterning device for use with a lithographic apparatus, the method comprising:
    forming a reflector portion, the reflector portion being configured to reflect incident radiation;
    forming an absorber portion, the absorber portion being configured to absorb incident radiation and to reflect a portion of incident radiation, wherein the reflector portion is formed beneath the absorber portion, the absorber portion comprising a first layer and a second layer, the first layer comprising a first material that is different from a second material of the second layer; and
    forming a phase tune portion between the reflector portion and the absorber portion, the phase tune portion being configured to induce a phase shift between the radiation reflected by the reflector portion and that has passed through the absorber portion and the portion of radiation reflected by the absorber portion such that the radiation reflected by the reflector portion destructively interferes with the portion of radiation reflected by the absorber portion.

* * * * *